(12) United States Patent
Hwang et al.

(10) Patent No.: US 12,690,369 B2
(45) Date of Patent: Jul. 21, 2026

(54) METHOD OF MANUFACTURING DISPLAY APPARATUS INCLUDING POLARIZATION FILM AND PROTECTIVE FILM

(71) Applicant: Samsung Display Co., Ltd., Yongin-si (KR)

(72) Inventors: Hyunmin Hwang, Yongin-si (KR); Jongwoo Park, Yongin-si (KR); Youngtae Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 504 days.

(21) Appl. No.: 18/109,033

(22) Filed: Feb. 13, 2023

(65) Prior Publication Data

US 2023/0389396 A1 Nov. 30, 2023

(30) Foreign Application Priority Data

May 27, 2022 (KR) ......................... 10-2022-0065594

(51) Int. Cl.
*H10K 59/80* (2023.01)
*H10K 71/00* (2023.01)

(52) U.S. Cl.
CPC ....... *H10K 59/873* (2023.02); *H10K 59/8793* (2023.02); *H10K 71/851* (2023.02)

(58) Field of Classification Search
CPC . H10K 59/873; H10K 59/8793; H10K 71/851
USPC .................. 257/40, 59, 91, 99, 100; 438/25
See application file for complete search history.

(56) References Cited

U.S. PATENT DOCUMENTS

| | | | | |
|---|---|---|---|---|
| 5,818,559 | A * | 10/1998 | Yoshida | ................. G02F 1/1333 349/122 |
| 9,989,811 | B2 | 6/2018 | Go et al. | |
| 11,201,317 | B2 | 12/2021 | Jung et al. | |
| 2007/0138949 | A1* | 6/2007 | Yoshida | ............... H10K 59/873 313/504 |
| 2008/0074584 | A1* | 3/2008 | Wu | ....................... G02B 5/3025 428/1.31 |
| 2012/0009702 | A1* | 1/2012 | Cho | .................... H10K 59/8722 438/26 |
| 2014/0017967 | A1* | 1/2014 | Kim | .................. G02F 1/133351 445/25 |
| 2017/0005291 | A1* | 1/2017 | Sung | .................... H10K 59/873 |

(Continued)

FOREIGN PATENT DOCUMENTS

| | | |
|---|---|---|
| KR | 10-2007-0014436 | 2/2007 |
| KR | 10-2012-0004861 | 1/2012 |

(Continued)

*Primary Examiner* — Eric W Jones
(74) *Attorney, Agent, or Firm* — Innovation Counsel LLP

(57) ABSTRACT

A display apparatus includes a display layer located on a surface of a substrate and including a plurality of pixels, a thin-film encapsulation layer located on the display layer, the thin-film encapsulation layer including at least one inorganic layer and at least one organic layer, a polarization film located on the thin-film encapsulation layer, and a protective film located on another surface of the substrate, which is opposite to the surface of the substrate, the protective film corresponding to the display layer. A difference between a coefficient of thermal expansion of the polarization film and a coefficient of thermal expansion of the protective film is in a range of about 0 μm/° C. to about 5 μm/° C.

13 Claims, 18 Drawing Sheets

(56) References Cited

U.S. PATENT DOCUMENTS

2017/0338441  A1*  11/2017  Higano ............... H10K 59/131
2018/0210288  A1    7/2018  Lee et al.

FOREIGN PATENT DOCUMENTS

KR      10-2014-0009920  A      1/2014
KR      10-2017-0032869  A      3/2017
KR      10-2020-0060654        6/2020
KR      10-2021-0052725        5/2021

* cited by examiner

METHOD OF MANUFACTURING DISPLAY APPARATUS INCLUDING POLARIZATION FILM AND PROTECTIVE FILM

CROSS-REFERENCE TO RELATED APPLICATION

This application claims priority to and benefits of Korean Patent Application No. 10-2022-0065594 under 35 U.S.C. § 119, filed in the Korean Intellectual Property Office on May 27, 2022, the entire contents of which are incorporated herein by reference.

BACKGROUND

1. Technical Field

One or more embodiments relate to a display apparatus and a method of manufacturing the display apparatus, which is capable of preventing deformation or damage.

2. Description of the Related Art

Recently, the usage of display apparatuses has been diversified. In addition, as display apparatuses have become thinner and more lightweight, the range of usage thereof is broadening.

In general, a display apparatus includes a thin-film transistor and display elements (for example, an organic light-emitting diode) formed on a substrate, and operates with the display elements emitting light. Such display apparatuses are used as displays of compact products such as mobile phones or of large-sized products such as televisions.

The display apparatuses are produced by simultaneously stacking a plurality of display panels on a mother substrate and then cutting them into a plurality of display apparatuses. In a process of manufacturing thin-type display apparatuses, deformation of or damage to the display apparatuses needs to be prevented.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display apparatus without deformation or damage.

Embodiments also provide a method of manufacturing a display apparatus, which is capable of preventing deformation or damage.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus includes a display layer located on a surface of a substrate and including a plurality of pixels, a thin-film encapsulation layer located on the display layer, the thin-film encapsulation layer including at least one inorganic layer and at least one organic layer, a polarization film located on the thin-film encapsulation layer, and a protective film located on another surface of the substrate, which is opposite to the surface of the substrate, the protective film corresponding to the display layer, wherein a difference between a coefficient of thermal expansion of the polarization film and a coefficient of thermal expansion of the protective film is in a range of about $0 \ \mu m/°C$. to about $\mu m/°C$.

According to an embodiment, the coefficient of thermal expansion of the polarization film may be in a range of about $1.5 \ \mu m/°C$. to about $7 \ \mu m/°C$.

According to an embodiment, the coefficient of thermal expansion of the protective film may be in a range of about $2 \ \mu m/°C$. to about $5 \ \mu m/°C$.

According to an embodiment, the protective film may include a thermosetting resin or an ultraviolet (UV) curing resin.

According to an embodiment, the substrate may include a glass substrate including glass.

According to an embodiment, a thickness of the substrate may be in a range of about 0.1 mm to about 0.4 mm.

According to an embodiment, the polarization film may cover an upper surface and a side surface of the thin-film encapsulation layer.

According to an embodiment, an area of the protective film may be less than an area of the substrate.

According to an embodiment, edges of the protective film may be at least partially spaced apart from an end of the substrate.

According to an embodiment, the protective film may have a quadrangular shape, a circular shape, or a shape of a plurality of line patterns.

According to one or more embodiments, a method of manufacturing a display apparatus includes forming a plurality of display portions on a surface of a mother substrate, forming a polarization film covering the plurality of display portions, forming a protective film on another surface of the mother substrate, which is opposite to the surface of the mother substrate, and cutting the mother substrate to separate the mother substrate into a plurality of display apparatuses. A difference between a coefficient of thermal expansion of the polarization film and a coefficient of thermal expansion of the protective film is in a range of about $0 \ \mu m/°C$. to about $5 \ \mu m/°C$.

According to an embodiment, the method may further include etching the mother substrate before the forming of the protective film.

According to an embodiment, the forming of the polarization film may be performed before or after the etching of the mother substrate.

According to an embodiment, the forming of the polarization film may include forming a plurality of preliminary polarization films which respectively correspond to the plurality of display portions and are separated from each other on the mother substrate, and removing outer regions of the plurality of preliminary polarization films.

According to an embodiment, the removing of the outer regions of the plurality of preliminary polarization films may be performed after the cutting of the mother substrate.

According to an embodiment, the removing of the outer regions of the plurality of preliminary polarization films includes using layer to remove the outer regions of the plurality of preliminary polarization films.

According to an embodiment, the forming of the polarization film may include forming, on the mother substrate, a single-body type preliminary polarization film, and leaving a first region of the single-body type preliminary polarization film, the first region corresponding to the plurality of display portions, and removing a second region of the single-body type preliminary polarization film, the second region being a remaining region other than the first region.

According to an embodiment, the method may further comprise cutting the mother substrate after the removing of the second region of the single-body type preliminary polarization film.

According to an embodiment, the protective film may include a thermosetting resin or a UV curing resin.

According to an embodiment, a thickness of the mother substrate may be in a range of about 0.1 mm to about 0.4 mm.

According to an embodiment, the protective film may be formed as a plurality of separated patterns on the another surface of the mother substrate.

According to an embodiment, the protective film may have a quadrangular shape, a circular shape, or a shape of a plurality of line patterns.

According to an embodiment, the protective film may include a material having a greater coefficient of thermal expansion than the coefficient of thermal expansion of the polarization film.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
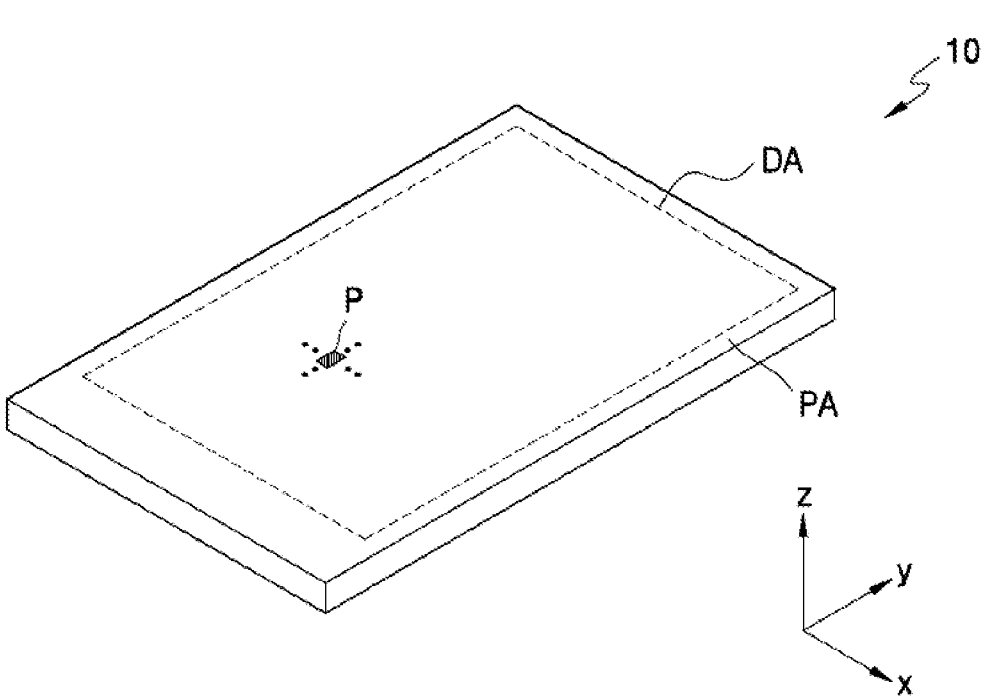
FIG. 1 is a perspective view schematically illustrating a display apparatus according to an embodiment.

In the following description, for the purposes of explanation, numerous specific details are set forth in order to provide a thorough understanding of various embodiments of implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limited.

Although the terms "first," "second," and the like may be used herein to describe various types of elements, these elements should not be limited by these terms. These terms are only used to distinguish one element from another element. Thus, a first element discussed below could be termed a second element without departing from the teachings of the disclosure.

The terminology used herein is for the purpose of describing particular embodiments and is not intended to be limiting. As used herein, the singular forms, "a," "an," and "the" are intended to include plural forms as well, unless the context clearly indicates otherwise.

Moreover, the terms "comprises," "comprising," "includes," "including," and/or "have" when used in this specification, specify the presence of stated features, integers, steps, operations, elements, components, and/or groups thereof, but do not preclude the presence or addition of one or more other features, integers, steps, operations, elements, components, and/or groups thereof.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When a wire is described as "extending in a first direction or a second direction", this includes a case where the wire extends in a linear form but also in a zigzag form or a curved form along the first direction or the second direction.

The phrase "on a plane" or "in a plan view" indicates a view of a portion of an object seen from above, and "on a cross-section" or "in a cross-sectional view" indicates a view of a portion of an object on a cross-section cut in a perpendicular direction. In the embodiments below, the term "overlap" includes both overlapping "in a plan view" and "on a cross-section."

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described in detail with reference to the accompanying drawings, and in the description with reference to the drawings, like reference numerals refer to like elements.

FIG. 1 is a perspective view schematically illustrating a display apparatus 10 according to an embodiment.

Referring to FIG. 1, the display apparatus 10 may include a display area DA in which an image is realized (or displayed) and a peripheral area PA in which the image is not realized. The display apparatus 10 may provide the image to the outside by using light emitted from the display area DA.

Although the display area DA of the display apparatus 10 has a quadrangular shape in FIG. 1, the disclosure is not limited thereto. The display area DA may have a circular shape, an elliptical shape or a polygonal shape such as a triangle or a pentagon. Although the display apparatus 10 of FIG. 1 is a flat panel display apparatus in a flat form, the display apparatus 10 may also be implemented in various forms such as a flexible, foldable, or rollable display apparatus.

Although not illustrated in the drawings, the display apparatus 10 may include a component (not shown). The component of the display apparatus 10 may include an electronic element that uses light or sound. For example, the electronic element of the display apparatus 10 may include a sensor that receives and uses light, such as an infrared sensor, a camera that receives light to capture (or generate) an image, a sensor that outputs and senses light or sound to measure a distance, a sensor that recognizes a fingerprint, a small-sized lamp that outputs light, or a speaker outputting sound.

Hereinafter, as the display apparatus 10 according to an embodiment, an organic light-emitting display apparatus is described as an example. However, the display apparatus 10 of the disclosure is not limited thereto, and as another embodiment, the display apparatus 10 according to the disclosure may include an inorganic light-emitting display apparatus (or inorganic EL display apparatus) or a quantum dot light-emitting display apparatus. For example, the display apparatus 10 may include an emission layer of a display element provided in the display area DA, and the emission layer of the display apparatus 10 may include an organic material, an inorganic material, quantum dots, an organic material and quantum dots, or a combination of an inorganic material and quantum dots.

Figure 2:
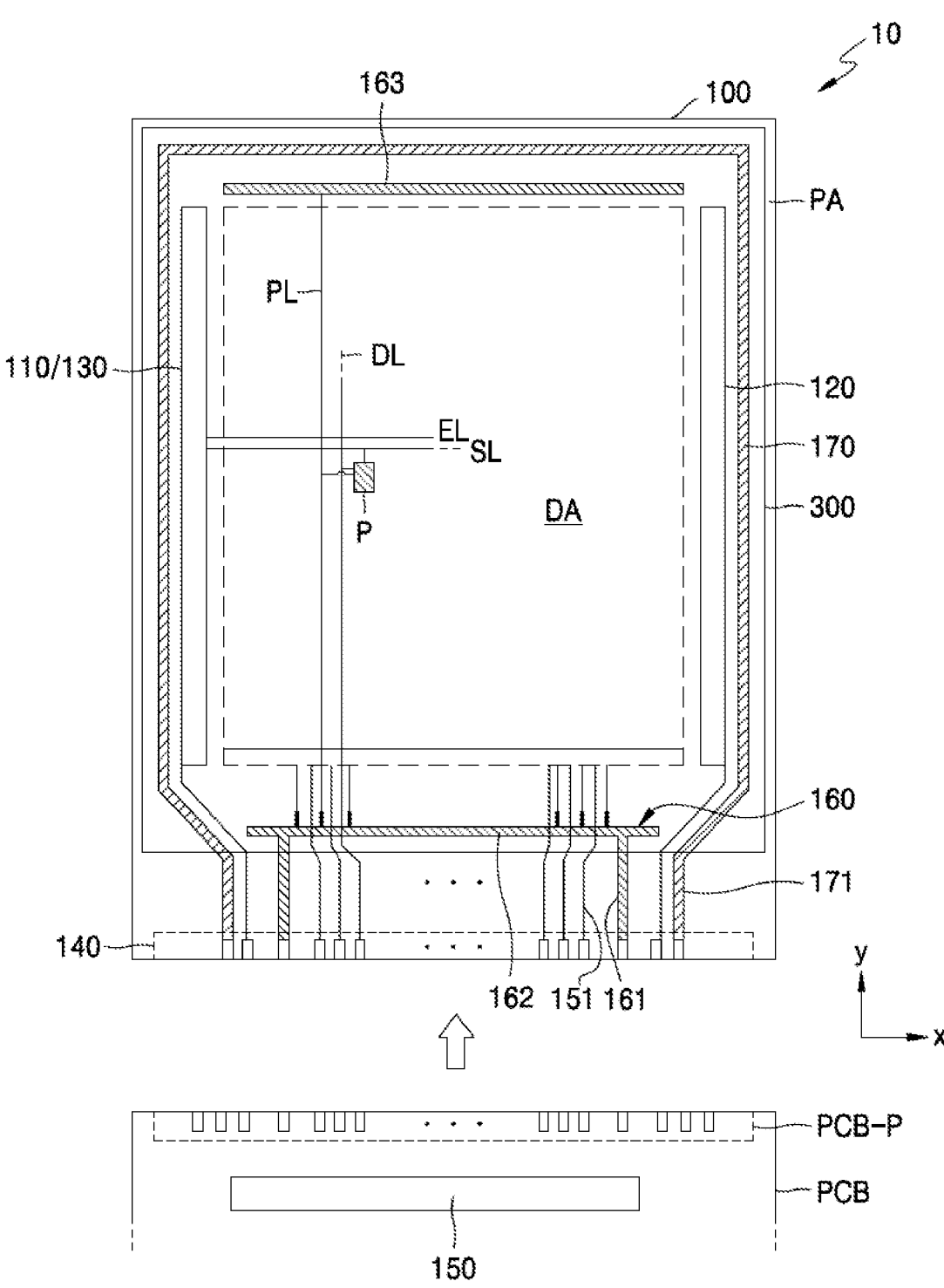
FIG. 2 is a plan view schematically illustrating a display apparatus according to an embodiment.

FIG. 2 is a plan view schematically illustrating the display apparatus 10 according to an embodiment.

Referring to FIG. 2, the display apparatus 10 may include the display area DA in which an image is realized (or displayed) and the peripheral area PA in which no image is realized.

Pixels P may be arranged on a substrate 100 in the display area DA. The substrate 100 may include a glass substrate including glass. Each of the pixels P may include a display element such as an organic light-emitting diode OLED (e.g., refer to FIG. 4). Each pixel P may emit, for example, red, green, blue, or white light through the organic light-emitting diode OLED.

A thin-film encapsulation layer 300 may be provided on the display element disposed on the substrate 100. The organic light-emitting diode OLED may be vulnerable to moisture and oxygen from the external air. Thus, the thin-film encapsulation layer 300 may seal the display area DA and prevent the moisture and oxygen from penetrating into the display area DA from the external air. The thin-film encapsulation layer 300 may protect the pixels P from the external air and improve the reliability of the display apparatus 10.

In an embodiment, the thin-film encapsulation layer 300 may have a stacked structure including at least one inorganic encapsulation layer and at least one organic encapsulation layer. The thin-film encapsulation layer 300 (e.g., the at least one inorganic encapsulation layer and the at least one organic encapsulation layer of the stacked structure) may not be separated from each other and may be integral with each other to cover the surface (e.g., the entire surface) of the display area DA.

The thin-film encapsulation layer 300 may be arranged (e.g., partially arranged) in the peripheral area PA. The thin-film encapsulation layer 300 may cover a portion or all of each of a first scan driving circuit 110 and a second scan driving circuit 120, an emission control driving circuit 130, a first power supply line 160, and a second power supply line 170. Detailed description of the above-described elements is provided below.

The thin-film encapsulation layer 300 including at least one inorganic encapsulation layer and at least one organic encapsulation layer may reduce a thickness of the display apparatus 10 and improve flexibility thereof.

In another embodiment, the pixels P may be sealed by a rigid upper substrate (not shown) instead of the thin-film encapsulation layer 300. The upper substrate may be bonded to the substrate 100 through a cell seal (e.g., frit) located in the peripheral area PA and encircle the display area DA (or e.g., may surround the display area DA).

Each pixel P may be electrically connected to external circuits arranged in the peripheral area PA. In the peripheral area PA, the first and second scan driving circuits 110 and 120, the emission control driving circuit 130, a terminal 140, the first power supply line 160, and the second power supply line 170 or the like may be arranged.

The first and second scan driving circuits 110 and 120 may provide a scan signal to each pixel P through a scan line SL. The first and second scan driving circuits 110 and 120 may be arranged on both sides (e.g., a left side and a right side) of the display apparatus 10 with the display area DA therebetween. For example, the display area DA may be disposed between the first and second scan driving circuits 110 and 120. Some of the pixels P arranged in the display area DA may be electrically connected to the first scan driving circuit 110 located on the left side of the display apparatus 10, and other pixels may be electrically connected to the second scan driving circuit 120 located on the right side of the display apparatus 10. In another embodiment, the first and second scan driving circuits 110 and 120 may be provided on only a side (e.g., the left side or the right side) of the display area DA.

At a side of the first scan driving circuit 110, the emission control driving circuit 130 that provides an emission control signal to each pixel through an emission control line EL may be further arranged.

The terminal 140 may be arranged at a side (e.g., a lower side) of the substrate 100. The terminal 140 may be exposed without being covered by an insulating layer and be electrically connected to a printed circuit board PCB.

A terminal PCB-P of the printed circuit board PCB may be electrically connected to the terminal 140 of the display apparatus 10. The printed circuit board PCB may be configured to transmit a signal or power from a controller (not shown) to the display apparatus 10.

A control signal generated by the controller (not shown) may be transmitted to each of the first and second scan driving circuits 110 and 120 and the emission control driving circuit 130 through the printed circuit board PCB. The controller may provide a first power voltage ELVDD (e.g., refer to FIG. 4) and a second power voltage ELVSS (e.g., refer to FIG. 4) to the first power supply line 160 and the second power supply line 170, respectively, through a first connection wire 161 and a second connection wire 171, respectively. The first power voltage ELVDD may be provided to each pixel P through a driving voltage line PL electrically connected to the first power supply line 160, and the second power voltage ELVSS may be provided to an opposite electrode of each pixel P electrically connected to the second power supply line 170.

The first power supply line 160 may be arranged on both sides (e.g., an upper side and the lower side) of the display apparatus 10 with the display area DA therebetween, and may include a first sub-wire 162 and a second sub-wire 163 extending in an x-direction. For example, the first sub-wire 162 and the second sub-wire 163 may be disposed on the lower side and the upper side of the display apparatus 10, respectively, and the display area DA may be disposed between the first sub-wire 162 and the second sub-wire 163.

The second power supply line 170 may be adjacent to (e.g., partially surround) the display area DA in a loop shape with a side open. For example, the lower side of the display apparatus 10 may be opened by the loop shaped second power supply line 170.

A data driving circuit 150 may be electrically connected to a data line DL. A data signal of the data driving circuit 150 may be provided to each pixel P through a connection wire 151 electrically connecting the terminal 140 to the data line DL. Although the data driving circuit 150 of FIG. 2 is disposed on the printed circuit board PCB, in another embodiment, the data driving circuit 150 may be disposed on the substrate 100. For example, the data driving circuit 150 may be disposed between the terminal 140 and the first power supply line 160.

Figure 3:
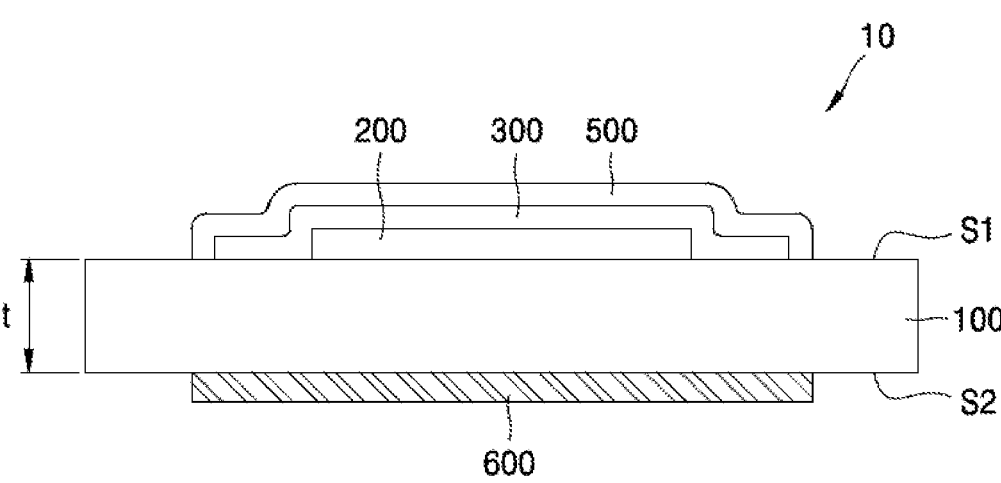
FIG. 3 is a cross-sectional view schematically illustrating a display apparatus according to an embodiment.

FIG. 3 is a cross-sectional view schematically illustrating the display apparatus 10 according to an embodiment.

A display layer 200 may be provided on a surface S1 of the substrate 100. The thin-film encapsulation layer 300 and a polarization film 500 may be disposed on the display layer 200. A protective film 600 may be disposed on another surface S2 that is opposite to the surface S1 of the substrate 100.

The substrate 100 may include the glass substrate including the glass. A thickness t of the substrate 100 may be about 0.1 mm or greater and about 0.4 mm or less. In case that the thickness t of the substrate 100 is less than about 0.1 mm, the thickness t of the substrate 100 may be very small, and the substrate 100 may be damaged during a handling process thereof. In case that the thickness t of the substrate 100 is greater than about 0.4 mm, flexibility of the substrate 100 may be limited, and the substrate 100 may be inappropriate to a flexible display apparatus.

The display layer 200 including the pixels P (e.g., refer to FIG. 2) may be provided on the surface S1 of the substrate 100.

Figure 4:
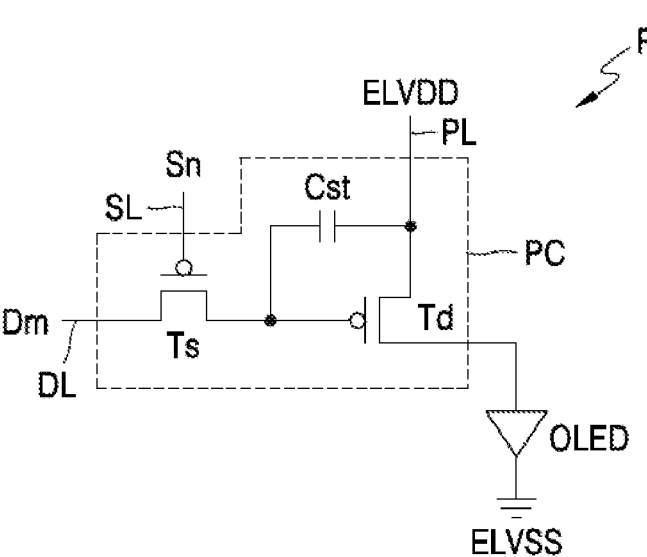
FIG. 4 is a schematic diagram of an equivalent circuit illustrating a pixel that may be included in a display apparatus according to an embodiment.

FIG. 4 is a schematic diagram of an equivalent circuit illustrating a pixel that may be included in a display apparatus according to an embodiment.

Referring to FIGS. 3 and 4, each pixel P may include a pixel circuit PC and the organic light-emitting diode OLED. The pixel circuit PC may be electrically connected to the scan line SL and the data line DL, and the organic light-emitting diode OLED may be electrically connected to the pixel circuit PC.

The pixel circuit PC may include a driving thin-film transistor Td, a switching thin-film transistor Ts, and a storage capacitor Cst. The switching thin-film transistor Ts may be electrically connected to the scan line SL and the data line DL, and may be configured to transmit a data signal Dm to the driving thin-film transistor Td. The data signal Dm may be input to the driving thin-film transistor Td through the data line DL according to a scan signal Sn input through the scan line SL.

The storage capacitor Cst may be electrically connected to the switching thin-film transistor Ts and the driving voltage line PL, and store a voltage corresponding to a difference between a voltage received from the switching thin-film transistor Ts and the first power voltage ELVDD (or a driving voltage) supplied to the driving voltage line PL.

The driving thin-film transistor Td may be electrically connected to the driving voltage line PL and the storage capacitor Cst. The driving thin-film transistor Td may control, in response to a voltage value stored in the storage capacitor Cst, a driving current flowing from the driving voltage line PL and through the organic light-emitting diode OLED. The organic light-emitting diode OLED may emit light having a luminance (e.g., a certain or selectable luminance) according to a driving current.

Although the pixel circuit PC of FIG. 4 includes two thin-film transistors and a storage capacitor, the disclosure is not limited thereto. In another embodiment, the pixel circuit PC may include, for example, seven thin-film transistors and a storage capacitor. In another embodiment, the pixel circuit PC may be modified in various manners. For example, the pixel circuit PC may include two or more storage capacitors.

The thin-film encapsulation layer 300 may be disposed on the display layer 200 and cover (e.g., completely cover) the display layer 200. The thin-film encapsulation layer 300 may have a stacked structure including at least one inorganic encapsulation layer and at least one organic encapsulation layer. In an embodiment, the thin-film encapsulation layer 300 may include a stacked structure in which a first inorganic encapsulation layer, a second inorganic encapsulation layer, and an organic encapsulation layer between the first inorganic encapsulation layer and the second inorganic encapsulation layer are formed.

The at least one inorganic encapsulation layer of the thin-film encapsulation layer 300 may include at least one inorganic material selected from aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). The zinc oxide ($ZnO_x$) may include zinc oxide (ZnO) and/or zinc peroxide ($ZnO_2$). The at least one organic encapsulation layer of the thin-film encapsulation layer 300 may include a polymer-based material. The polymer-based material may include an acrylic resin, an epoxy-based resin, polyimide, polyethylene, and the like. In an embodiment, the at least one organic encapsulation layer may include an acrylate. However, the embodiments are not limited thereto.

The polarization film 500 may be disposed on the thin-film encapsulation layer 300. The polarization film 500 may cover (e.g., completely cover) an upper surface and a side surface of the thin-film encapsulation layer 300, and a size of the polarization film 500 may be larger than a size of the thin-film encapsulation layer 300 in a plan view.

A coefficient of thermal expansion of the polarization film 500 may be about 1.5 μm/° C. to about 7 μm/° C. The polarization film 500 may be formed by selecting a material having a coefficient of thermal expansion that is different from the coefficient of thermal expansion of the protective film 600 by about 0 μm/° C. to about 5 μm/° C. Detailed description of the protective film 600 is provided below.

Although not shown in the drawings, a touch sensor layer (not shown) may be further arranged between the thin-film encapsulation layer 300 and the polarization film 500.

The touch sensor layer may include a touch electrode and touch wires electrically connected to the touch electrode and sense an external input (e.g., coordinate information) according to a touch event. The touch sensor layer may sense an external input by using a self-capacitance method or a mutual capacitance method.

The protective film 600 may be disposed on the another surface S2 opposite to the surface S1 of the substrate 100. The protective film 600 may prevent damage to a surface of the substrate 100 or a mother substrate 1000 (e.g., refer to FIG. 7A) due to scratches in a cell cutting process of dividing the mother substrate 1000 into multiple display apparatuses or a modular process in which assembling accessories are assembled to a display apparatus.

The protective film 600 may be formed on the another surface S2 of the mother substrate 1000 by screen printing. For example, the protective film 600 may be formed before or after an etching process of the mother substrate 1000, before cell cutting of the mother substrate 1000.

The protective film 600 may include at least one thermosetting resin selected from an epoxy resin, a polyester resin, a phenol resin, a polyimide resin, a vinyl ester resin, and a melamine resin. For example, multiple protective films 600 may include an ultraviolet (UV) curing resin.

The coefficient of thermal expansion of the protective film 600 may be about 2 μm/° C. to about 5 μm/° C. The protective film 600 may be formed by selecting a material having a coefficient of thermal expansion that is different from the coefficient of thermal expansion of the polarization film 500 by about 0 μm/° C. to about 5 μm/° C. By setting a difference between the coefficients of thermal expansion of the polarization film 500 and the protective film 600 may be set to about 5 μm/° C. or less, deformation of the display apparatus 10 due to the difference between the coefficients of thermal expansion of the polarization film 500 and the protective film 600 in a process of applying a high-temperature process in a manufacturing process of the display apparatus 10 may be reduced.

Figure 5A:
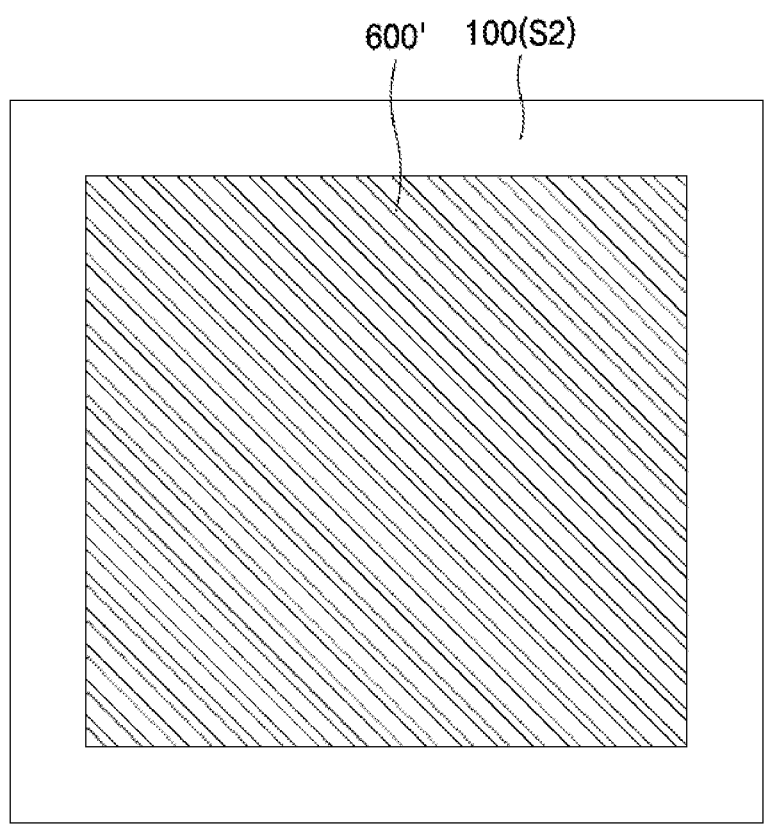
FIGS. 5A to 5C are rear views schematically illustrating a display apparatus according to an embodiment.
Figure 5B:
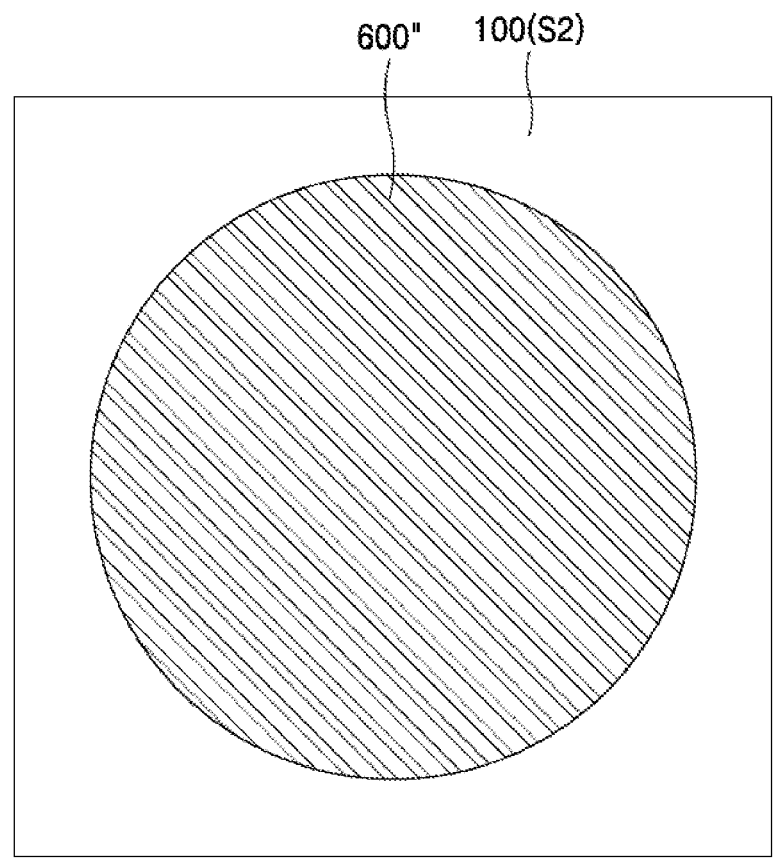
Figure 5C:
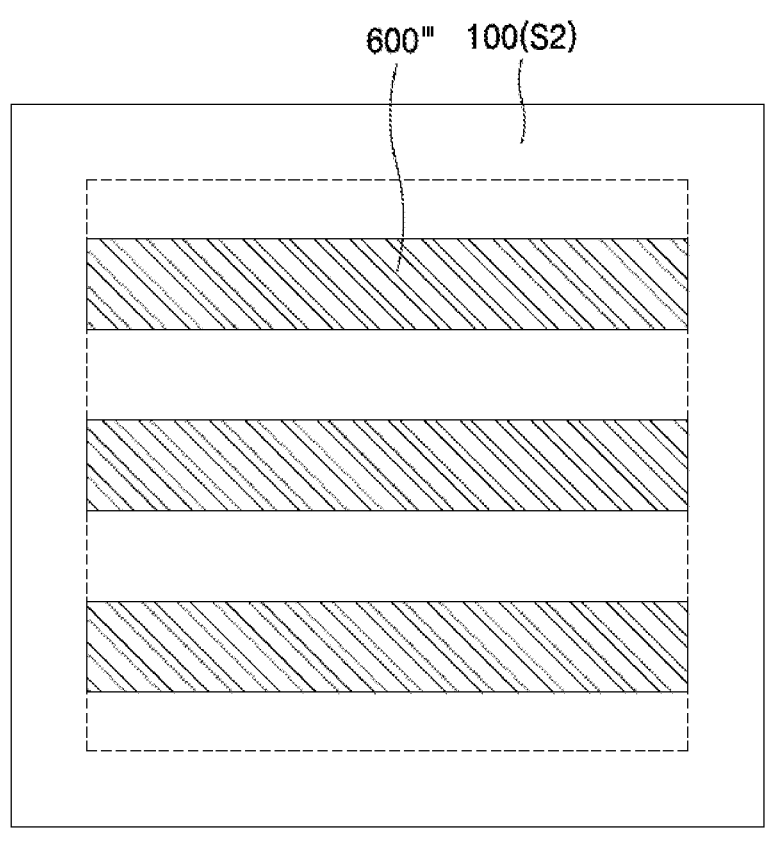

FIGS. 5A to 5C are rear views schematically illustrating a display apparatus according to an embodiment.

Referring to FIG. 5A, a protective film 600' may be disposed in a rectangular shape on the another surface S2 of the substrate 100. Referring to FIG. 5B, a protective film 600'' may be formed in a circular shape on the another surface S2 of the substrate 100. Referring to FIG. a protective film 600''' may be formed in line shapes on the another surface S2 of the substrate 100.

The protective films 600', 600'' and 600''' of FIGS. 5A to 5C may be respectively obtained as a result of patterning protective films 600*a*, 600*b*, and 600*c* on another surface 1000*b* of the mother substrate 1000 (e.g., refer to FIGS. 9A, 9B, and 9C), and screen printing the same, and then cell cutting the mother substrate 1000 into the multiple display apparatuses Areas of the protective films 600', 600'', and 600''' of FIGS. 5A to 5C may each be smaller than an area of the substrate 100.

The protective films 600' and 600'' of FIGS. 5A and 5B may be formed in a size to cover the display layer 200 (e.g., refer to FIG. 3) at a position corresponding to the display layer 200, and edges of the protective films 600' and 600'' may be spaced apart from an end of the substrate 100. The protective film 600''' of FIG. 5C may not completely cover the display layer 200 (e.g., refer to FIG. 3), and some edges of the protective film 600''' may coincide with the end of the substrate 100.

Figure 6:
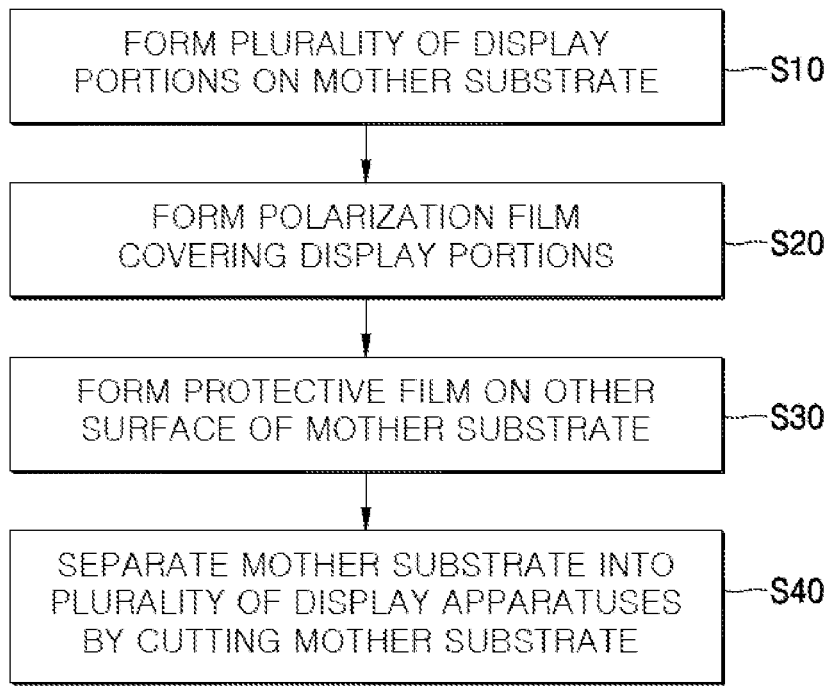
FIG. 6 is a flowchart schematically illustrating a method of manufacturing a display apparatus, according to an embodiment.

FIG. 6 is a flowchart schematically illustrating a method of manufacturing a display apparatus, according to an embodiment. FIGS. 7A to 7D are schematic cross-sectional views illustrating a method of manufacturing a display apparatus, according to an embodiment. FIG. 8A to 8C are schematic cross-sectional views illustrating a method of manufacturing a display apparatus, according to another embodiment.

Referring to FIG. 6, the method of manufacturing a display apparatus, according to an embodiment, may include forming display portions on a mother substrate (S10), forming a polarization film covering the display portions (S20), forming a protective film on another surface of the mother substrate (S30), and separating the mother substrate into display apparatuses by cutting the mother substrate (S40).

The forming of the polarization film (S20) may be performed before or after an etching operation of the mother substrate. According to an embodiment, after forming the polarization film (S20), the mother substrate may be etched, and a protective film may be formed on another surface of the mother substrate (S30). According to another embodiment, after the etching of the mother substrate, a polarization film may be formed (S20), and a protective film may be formed on the another surface of the mother substrate (S30).

FIGS. 7A to 7D are schematic cross-sectional views illustrating a method manufacturing a display apparatus, according to an embodiment.

Figure 7A:
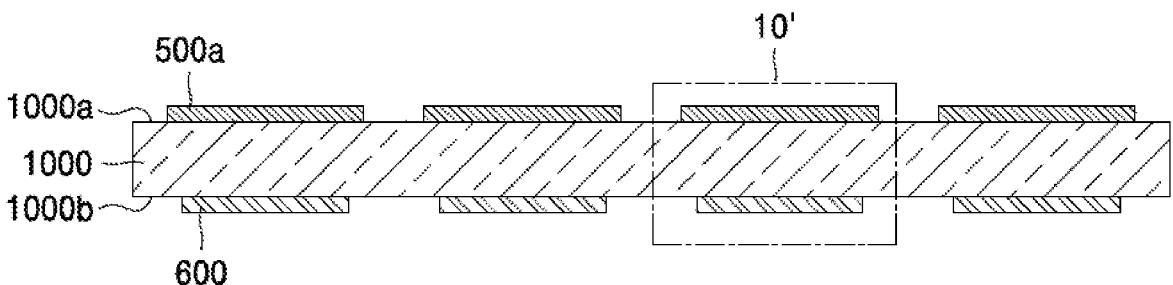
FIGS. 7A to 7D are schematic cross-sectional views illustrating a method of manufacturing a display apparatus, according to an embodiment.
Figure 8A:
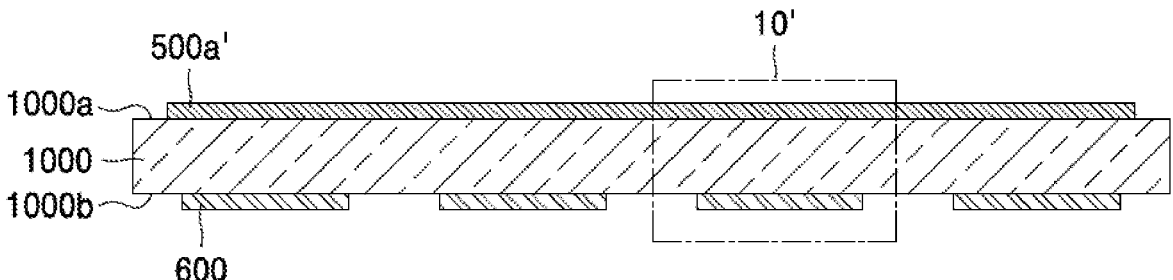
FIGS. 8A to 8C are schematic cross-sectional views illustrating a method of manufacturing a display apparatus, according to another embodiment.
Figure 8B:
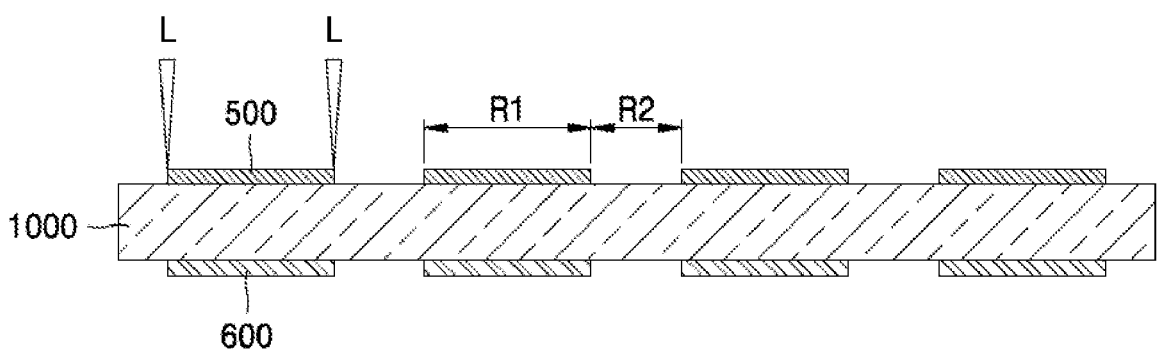
Figure 8C:
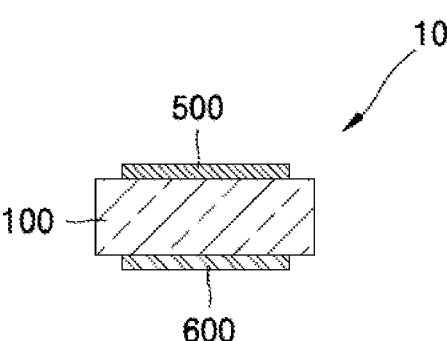

Referring to FIG. 7A, preliminary polarization films 500*a* may be arranged apart from each other on a surface 1000*a* of the mother substrate 1000, and protective films 600 may be arranged apart from each other on another surface 1000*b* of the mother substrate 1000. Thus, preliminary display apparatuses 10' may be formed.

The mother substrate 1000 may include a glass substrate including glass. A thickness of the mother substrate 1000 may be about 0.1 mm or greater and about 0.4 mm or less. In case that the thickness of the mother substrate 1000 is less than about 0.1 mm, the thickness of the mother substrate 1000 may be very small, and the mother substrate 1000 may be damaged during a handling process thereof. In case that the thickness of the mother substrate 1000 is greater than about 0.4 mm, due to limited flexibility, it may be inappropriate to use the mother substrate 1000 in a flexible display apparatus.

In another embodiment, the thickness of the mother substrate 1000 may be greater than or equal to about 0.4 mm. The mother substrate 1000 having a small thickness may be formed by etching. For example, the thickness of the mother substrate 1000 may be about 0.1 mm or greater and about 0.4 mm or less by etching.

The method may further include etching the mother substrate 1000 before the forming of the protective film 600 (S30) to form the mother substrate 1000 having the small thickness. As an example, in case that the thickness of the mother substrate 1000 is greater than about 0.4 mm, the mother substrate 1000 (e.g., the entire surface of the mother substrate 1000) may be etched, and the overall thickness of the mother substrate 1000 may be less than or equal to about mm before the forming of the protective film 600 (S30).

In an embodiment, the etching of the mother substrate 1000 may include etching a partial thickness of the mother substrate 1000. For example, the etching of the mother substrate 1000 may include etching a thickness of a region of the mother substrate 1000, the region corresponding to a scribing line. As another example, the etching of the mother substrate 1000 may include etching a thickness of the mother substrate 1000 corresponding to a bent area.

Although not shown in detail in the drawings, display portions (not shown) may be formed between the surface 1000*a* of the mother substrate 1000 and the preliminary polarization films 500*a*. Each display portion (not shown) may include the display layer 200 and the thin-film encapsulation layer 300 illustrated in FIG. 3, and the above-described elements are omitted in FIGS. 7A to 7D for convenience of description.

The preliminary polarization films 500*a* may cover (e.g., completely cover) the display portions (not shown), respectively. For example, each preliminary polarization film 500*a* may cover (e.g., completely cover) the upper surface and the side surface of each thin-film encapsulation layer 300 of FIG. 3.

The protective films 600 may be formed on the another surface 1000*b* of the mother substrate 1000. Each of the protective films 600 may be formed to correspond to (or disposed in) a display area and have a size wider than the display area. The protective films 600 may be formed separately from each other.

The protective films 600 may be formed on the another surface 1000*b* of the mother substrate 1000 by screen printing, before or after an etching process of the mother substrate 1000, and before cell cutting of the mother substrate 1000.

The protective films 600 may include a thermosetting resin or a UV curing resin, and a coefficient of thermal expansion thereof may be about 2 μm/° C. to about 5 μm/° C.

The protective films 600 may be formed by selecting a material having a coefficient of thermal expansion that is different from the coefficient of thermal expansion of the preliminary polarization films 500*a* by about 0 μm/° C. to about 5 μm/° C.

In case that a difference between the coefficients of thermal expansion of the preliminary polarization films 500*a* and the protective films 600 exceeds 5 μm/° C., deformation of the mother substrate 1000 may occur in a high-temperature process. For example, in case that the mother substrate 1000 is put into (or disposed in) a high temperature chamber of 90° C. or higher to cure the protective films 600, and the difference between the coefficients of thermal expansion of the preliminary polarization films 500*a* and the protective films 600 may be relatively large, and the mother substrate

1000 may be deformed (e.g., cracked or chipped), or the preliminary display apparatuses 10' may be deformed. Thus, process difficulty may be increased due to a step difference (or height or thickness difference) caused by the deformation in subsequent processes.

However, according to an embodiment, the difference between the coefficients of thermal expansion of the preliminary polarization films 500a and the protective films 600 may be set to 5 $\mu$m/° C. or less, and problems due to deformation of the mother substrate 1000 and the preliminary display apparatuses 10' may be prevented (or addressed).

The preliminary polarization films 500a may be formed before or after the etching operation of the mother substrate 1000. According to an embodiment, after forming the preliminary polarization films 500a, the mother substrate 1000 may be etched, and the protective films 600 may be formed on the another surface 1000b of the mother substrate 1000. According to another embodiment, after the etching of the mother substrate 1000, the preliminary polarization films 500a may be formed, and the protective films 600 may be formed on the another surface 1000b of the mother substrate 1000.

Figure 7B:
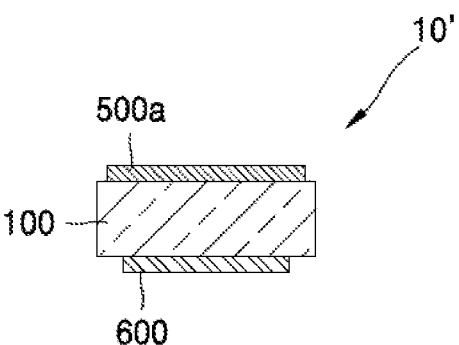

Referring to FIG. 7B, the mother substrate 1000 may be separated through a scribing process, the structure of FIG. 7A may be separated into the preliminary display apparatuses 10'.

In the scribing process, a laser beam or a wheel cutter (not shown) may be used. The laser beam may include a $CO_2$ laser or an yttrium aluminum garnet (YAG) laser. In other embodiments, by using the wheel cutter, a scribing line may be formed by applying a force from an upper surface of the mother substrate 100 in a direction toward the mother substrate 1000 without inverting the mother substrate 1000.

In a preliminary display apparatus 10' illustrated in FIG. 7B, a preliminary polarization film 500a may be formed on the upper surface of the substrate 100, which is obtained by separating the mother substrate 1000, and each protective film 600 may be formed on a lower surface of the substrate 100.

Figure 7C:
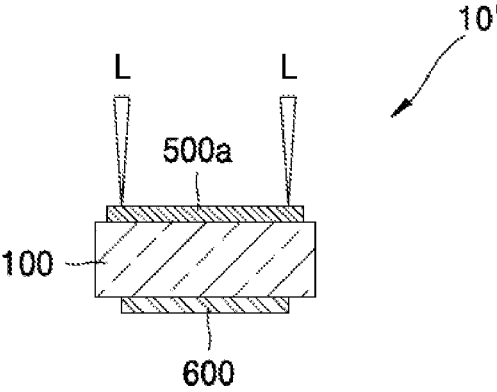

Referring to FIG. 7C, outer regions of the preliminary polarization film 500a may be removed from the preliminary display apparatus 10'. In the forming of the preliminary polarization film 500a, the preliminary polarization film 500a having a relatively large size that is enough to cover the thin-film encapsulation layer 300 of the preliminary display apparatus 10' may be formed to protect the preliminary display apparatus 10'. After the separating of the mother substrate 1000 into the preliminary display apparatuses 10' by the scribing process, outer regions of the preliminary polarization film 500a may be removed and only necessary spaces may be left on an outer surface of the thin-film encapsulation layer 300. Thus, a dead space of the preliminary display apparatus 10' may be reduced. In the removing of the outer regions of the preliminary polarization film 500a, laser L may be used.

Figure 7D:
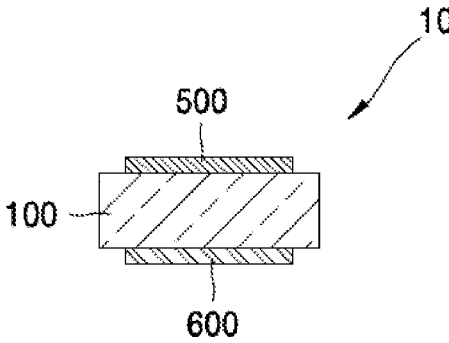

FIG. 7D illustrates the display apparatus 10 that is formed after the removing of the outer regions of the preliminary polarization film 500a. The display apparatus 10 of FIG. 7D may be substantially the same as the display apparatus 10 illustrated in FIG. 3.

FIGS. 8A to 8C are schematic cross-sectional views illustrating a method of manufacturing a display apparatus, according to another embodiment.

Referring to FIG. 8A, a single-body type preliminary polarization films 500a' may be arranged on a surface 1000a of a mother substrate 1000, and protective films 600 may be arranged apart from each other on another surface 1000b of the mother substrate 1000. Thus, preliminary display apparatuses 10' may be formed.

The embodiment of FIG. 8A is different from the embodiment of FIG. 7A at least in that the preliminary polarization film 500a' is formed as a single body without being separated. The mother substrate 1000 (e.g., the entire surface of the mother substrate 1000) may be supported by using the preliminary polarization film 500a' which is a single-body type, a process of etching the mother substrate 1000 and a process of forming the protective film 600 on the mother substrate 1000 may be performed safely, and the occurrence of curls of the mother substrate 1000 may be reduced (or prevented).

Referring to FIG. 8B, the preliminary polarization film 500a' (e.g., refer to FIG. 8A) of the single-body type may be separated into polarization films 500 before a cutting process of the mother substrate 1000.

A first region R1 of the preliminary polarization film 500a' may be left (or remained). The first region R1 may correspond to a display area DA (e.g., refer to FIG. 1). A second region R2 may be removed. The second region R2 may be an outer region of the first region R1. Thus, the preliminary polarization film 500a', which is the single-body type, may be separated into the polarization films 500. The laser L may be used to remove the second region R2.

Referring to FIG. 8C, the mother substrate 1000 may be separated through a scribing process. The structure of FIG. 8B may be separated into multiple display apparatuses 10. In the scribing process, a laser beam or a wheel cutter (not shown) may be used as described above.

The display apparatus 10 of FIG. 8C may be substantially the same as the display apparatus 10 illustrated in FIG. 3. Thus, detailed description of the same constituent elements is omitted.

Figure 9A:
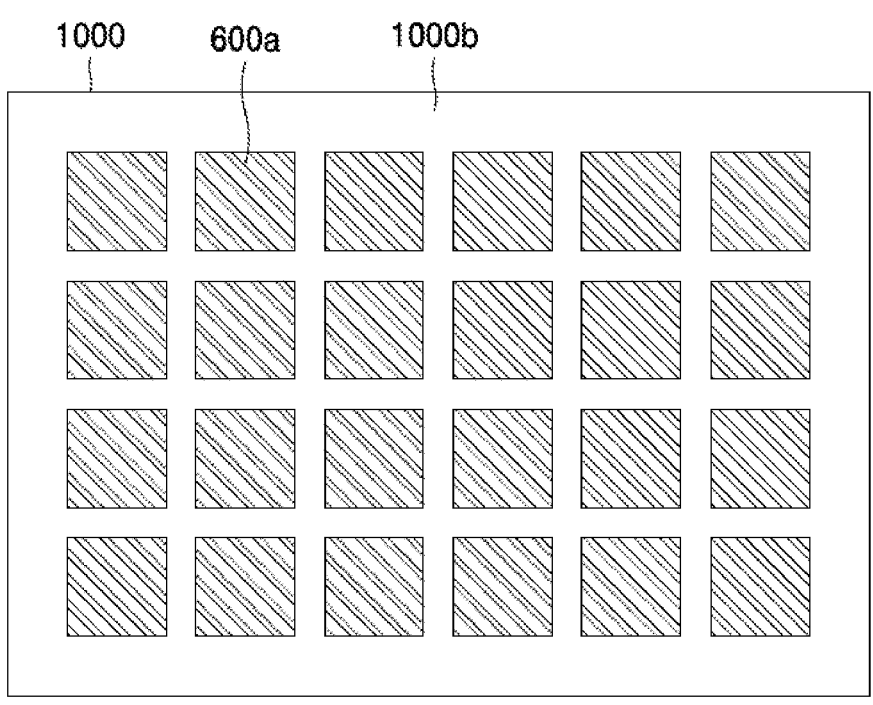
FIGS. 9A to 9C are schematic rear views of a mother substrate on which protective films in various forms are formed.
Figure 9B:
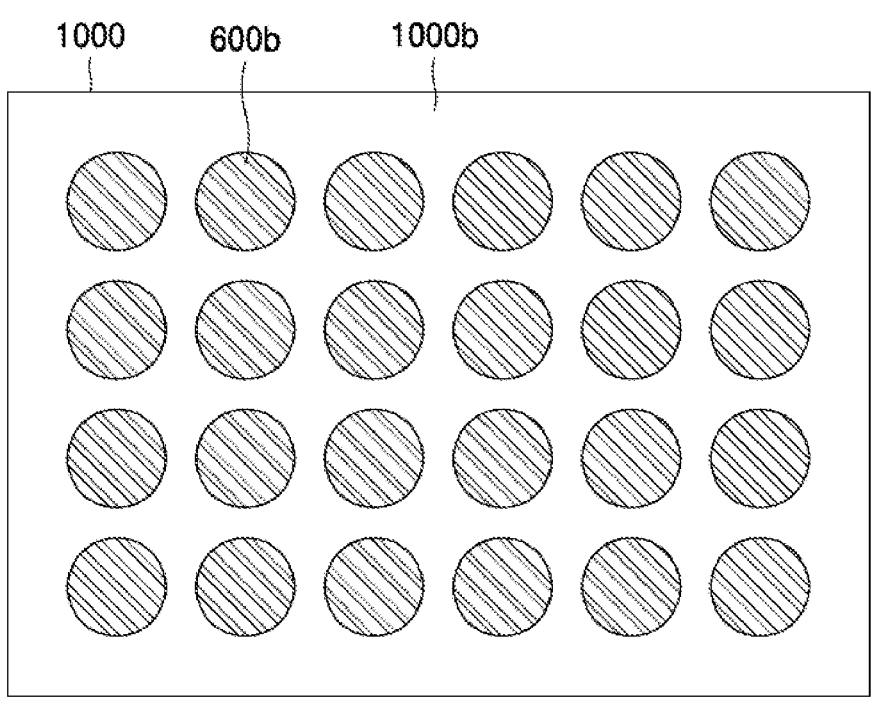
Figure 9C:
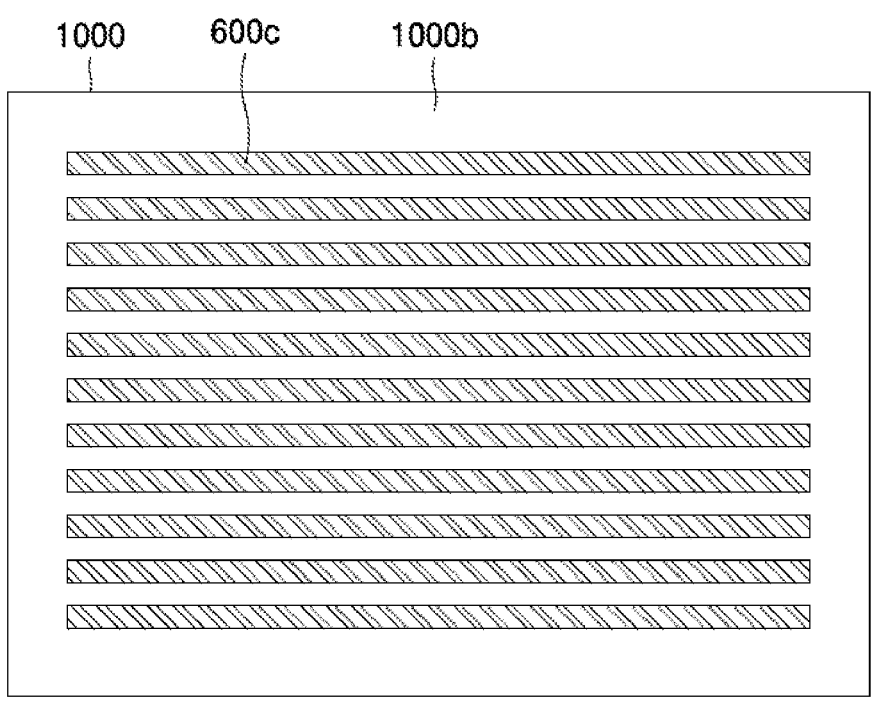

FIGS. 9A to 9C are schematic rear views of a mother substrate on which protective films in various forms are formed.

Referring to FIG. 9A, the protective film 600a may be disposed in a quadrangular shape on the another surface 1000b of the mother substrate 1000. Referring to FIG. 9B, a protective film 600b may be formed in a circular shape on the another surface 1000b of the mother substrate 1000. Referring to FIG. 9C, a protective film 600c may be formed in line shapes on the another surface 1000b of the mother substrate 1000.

The protective films 600a and 600b of FIGS. 9A and 9B may be formed separately in a size that covers an area corresponding to the display layer 200 (e.g., refer to FIG. 3), at a position corresponding to the display layer 200. Also, the protective film 600c of FIG. 9C may not completely cover the area corresponding to the display layer 200, but may be formed separately. For example, the protective film 600c of FIG. 9C may cover a portion of the display layer 200.

The protective films of 600a, 600b, and 600c of FIGS. 9A to 9C may all be formed in separate patterns, instead of the single-body type pattern. The protective films 600a, 600b, and 600c may be smaller than a size of the mother substrate 1000. Patterns of the protective films 600a, 600b, and 600c may be spaced apart from each other at intervals (e.g., certain or selectable intervals). Thus, stress of the protective films 600a, 600b, and 600c due to thermal expansion may be dispersed, and deformation of the mother substrate 1000 may be prevented.

According to an embodiment, deformation or damage during a manufacturing process of a display apparatus, in which a thin-film substrate is used, may be prevented.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a display apparatus, the method comprising:
   forming a plurality of display portions on a surface of a mother substrate;
   forming a polarization film covering the plurality of display portions;
   forming a protective film on another surface of the mother substrate, which is opposite to the surface of the mother substrate; and
   cutting the mother substrate to separate the mother substrate into a plurality of display apparatuses,
   wherein a difference between a coefficient of thermal expansion of the polarization film and a coefficient of thermal expansion of the protective film is in a range of about 0 μm/° C. to about 5 μm/° C., and
   wherein each of the plurality of display portions includes a display layer, and a thin-film encapsulation layer covering an upper surface and a side surface of the display layer, and
   the polarization film covers an upper surface and a side surface of the thin-film encapsulation layer of each of the plurality of display portions.

2. The method of claim 1, further comprising:
   etching the mother substrate before the forming of the protective film.

3. The method of claim 2, wherein the forming of the polarization film is performed before or after the etching of the mother substrate.

4. The method of claim 1, wherein the forming of the polarization film comprises:
   forming a plurality of preliminary polarization films which respectively correspond to the plurality of display portions and are separated from each other on the mother substrate; and
   removing outer regions of the plurality of preliminary polarization films.

5. The method of claim 4, wherein the removing of the outer regions of the plurality of preliminary polarization films is performed after the cutting of the mother substrate.

6. The method of claim 4, wherein the removing of the outer regions of the plurality of preliminary polarization films includes using a laser to remove the outer regions of the plurality of preliminary polarization films.

7. The method of claim 1, wherein the forming of the polarization film comprises:
   forming, on the mother substrate, a single-body type preliminary polarization film; and
   leaving a first region of the single-body type preliminary polarization film, the first region corresponding to the plurality of display portions, and removing a second region of the single-body type preliminary polarization film, the second region being a remaining region other than the first region.

8. The method of claim 7, further comprising:
   cutting the mother substrate after the removing of the second region of the single-body type preliminary polarization film.

9. The method of claim 1, wherein the protective film comprises a thermosetting resin or an ultraviolet (UV) curing resin.

10. The method of claim 1, wherein a thickness of the mother substrate is in a range of about 0.1 mm to about 0.4 mm.

11. The method of claim 1, wherein the protective film is formed as a plurality of separated patterns on the another surface of the mother substrate.

12. The method of claim 11, wherein the protective film has a quadrangular shape, a circular shape, or a shape of a plurality of line patterns.

13. The method of claim 11, wherein the protective film comprises a material having a greater coefficient of thermal expansion than the coefficient of thermal expansion of the polarization film.

* * * * *